United States Patent
Ishida et al.

(10) Patent No.: US 10,867,721 B2
(45) Date of Patent: Dec. 15, 2020

(54) WIRE HARNESS

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Hidetoshi Ishida, Mie (JP); Housei Mizuno, Mie (JP); Hiroki Hirai, Mie (JP); Makoto Higashikozono, Mie (JP); Toru Tanji, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/485,267

(22) PCT Filed: Feb. 6, 2018

(86) PCT No.: PCT/JP2018/003985
§ 371 (c)(1),
(2) Date: Aug. 12, 2019

(87) PCT Pub. No.: WO2018/155166
PCT Pub. Date: Aug. 30, 2018

(65) Prior Publication Data
US 2019/0392963 A1 Dec. 26, 2019

(30) Foreign Application Priority Data

Feb. 23, 2017 (JP) .................................. 2017-032135
Aug. 4, 2017 (JP) .................................. 2017-151457

(51) Int. Cl.
H01B 7/00 (2006.01)
H05K 7/06 (2006.01)
(Continued)

(52) U.S. Cl.
CPC ............. *H01B 7/0045* (2013.01); *H05K 7/06* (2013.01); *B29C 65/08* (2013.01);
(Continued)

(58) Field of Classification Search
CPC ...... H01B 7/0045; H05K 7/06; H05K 9/0098; B29C 65/08; B29K 2101/12;
(Continued)

(56) References Cited

U.S. PATENT DOCUMENTS 3,819,848 A  6/1974 Fry
4,589,584 A * 5/1986 Christiansen ........... B29C 65/08
156/73.4
(Continued)

FOREIGN PATENT DOCUMENTS

JP  54-126283  10/1979
JP  55-96516   7/1980
(Continued)

OTHER PUBLICATIONS

English machine translation of Ito (JP 2015/076952) provided with Office Action (Year: 2015).*
(Continued)

*Primary Examiner* — Roshn K Varghese
(74) *Attorney, Agent, or Firm* — Greenblum & Bernstein, P.L.C.

(57) ABSTRACT

A wire harness includes a functional exterior component shaped into a sheet and an electric wire disposed to overlap with the functional exterior component in at least a part of a region along a longitudinal direction. At least a part of an
(Continued)

overlap between the insulating covering of the electric wire and the functional exterior component is welded.

18 Claims, 5 Drawing Sheets

(51) Int. Cl.
    *B29K 101/12*     (2006.01)
    *B29L 31/30*     (2006.01)
    *B29C 65/08*     (2006.01)

(52) U.S. Cl.
    CPC .. *B29K 2101/12* (2013.01); *B29K 2995/0069* (2013.01); *B29L 2031/30* (2013.01)

(58) Field of Classification Search
    CPC ........ B29K 2995/0069; B29L 2031/30; B23K 20/10; H02G 3/20; B60R 16/0215
    See application file for complete search history.

(56) References Cited

U.S. PATENT DOCUMENTS

| | | | | |
|---|---|---|---|---|
| 4,730,764 | A * | 3/1988 | Hawkins | H01R 43/0207 228/1.1 |
| 5,160,812 | A * | 11/1992 | Takahashi | F16L 3/08 174/135 |
| 5,327,644 | A | 7/1994 | Tanaka et al. | |
| 8,740,223 | B1 * | 6/2014 | Alpi | H02G 3/0481 277/312 |
| 2002/0096358 | A1 * | 7/2002 | Murakami | H01B 11/1091 174/251 |
| 2004/0038598 | A1 * | 2/2004 | Steiner | B23K 20/10 439/894 |
| 2008/0190544 | A1 * | 8/2008 | Hopf | C09J 7/21 156/73.5 |

FOREIGN PATENT DOCUMENTS

| | | |
|---|---|---|
| JP | 58-192408 | 12/1983 |
| JP | 5-46608 | 6/1993 |
| JP | 5-269943 | 10/1993 |
| JP | 5-334925 | 12/1993 |
| JP | 7-222332 | 8/1995 |
| JP | 7-320544 | 12/1995 |
| JP | 11-346416 | 12/1999 |
| JP | 2011-207255 | 10/2011 |
| JP | 2012-29504 | 2/2012 |
| JP | 2012-119357 | 6/2012 |
| JP | 2013-240244 | 11/2013 |
| JP | 2014-204485 | 10/2014 |
| JP | 2015-72798 | 4/2015 |
| JP | 2015-74365 | 4/2015 |
| JP | 2015-76952 | 4/2015 |

OTHER PUBLICATIONS

English machine translation of Ogoshi (HJP 11-346416) provided with Office Action (Year: 1999).*
English machine translation of Suzuki (JP2013-240244) provided with Office Action (Year: 2013).*
Office Action issued in Japan Counterpart Patent Appl. No. 2017-151457, dated Oct. 2, 2018 (with an English translation thereof).
Office Action issued in Japan Counterpart Patent Appl. No. 2017-151457, dated Dec. 11, 2018 (with an English translation thereof).
Official Communication issued in International Bureau of WIPO Patent Application No. PCT/JP2018/003985, dated Mar. 6, 2018 (in English).
Official Communication in counterpart Japanese Patent Application No. 2019-018810 dated Oct. 23, 2019 (with English translation).
International Preliminary Report on Patentability issued in International Bureau of WIPO Patent Application No. PCT/JP2018/003985, dated Sep. 6, 2019 (with English translation).
Japanese Office Action, Japanese Patent Office, Application No. 2019-018810, dated Jun. 30, 2020, English translation.
Chinese Office Action, Chinese Patent Office, Application No. 201880012828.5, dated Apr. 2, 2020, with English translation thereof.
Japanese Office Action, Japanese Patent Office, Application No. 2019-149862, dated Jul. 21, 2020, English translation.

* cited by examiner

F I G. 1
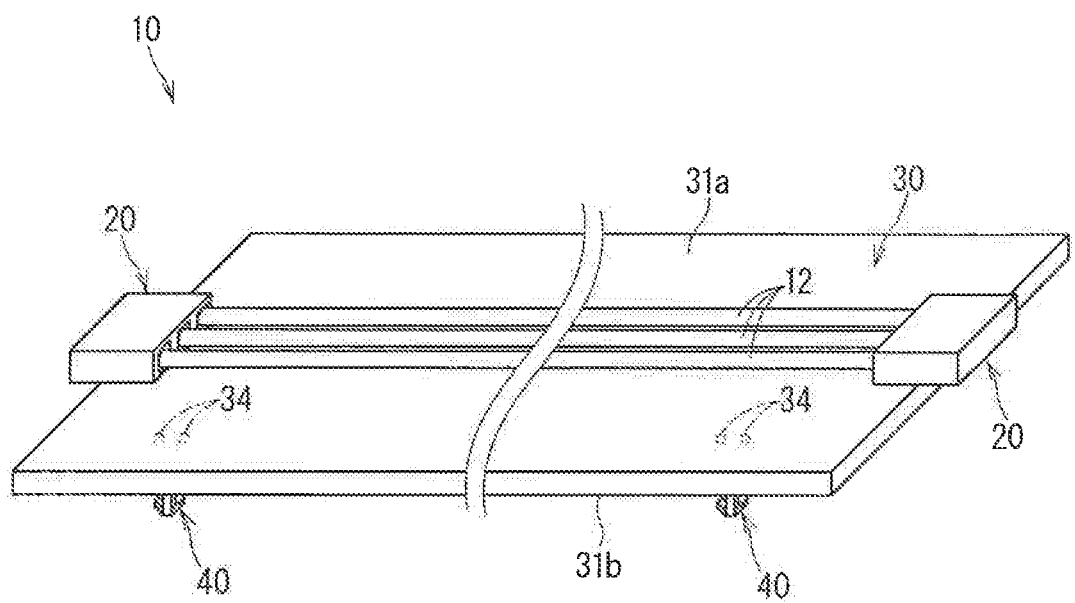
F I G. 2
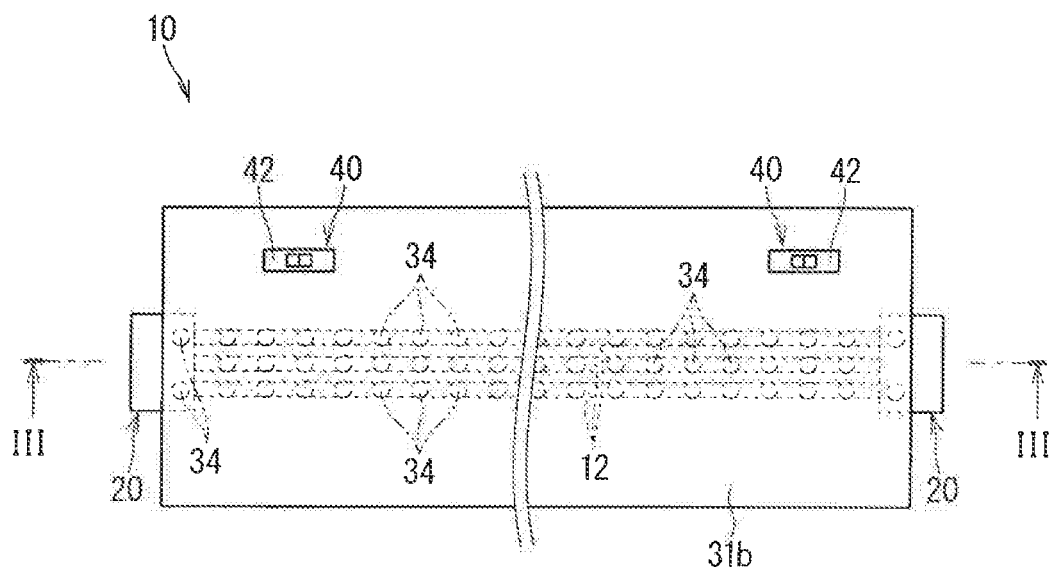

F I G. 9
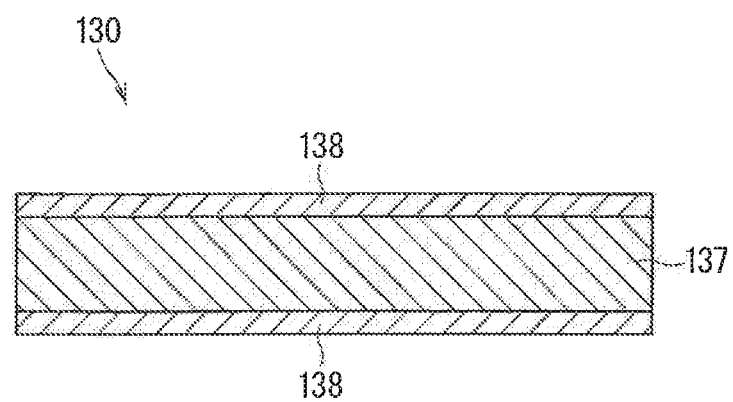
F I G. 10
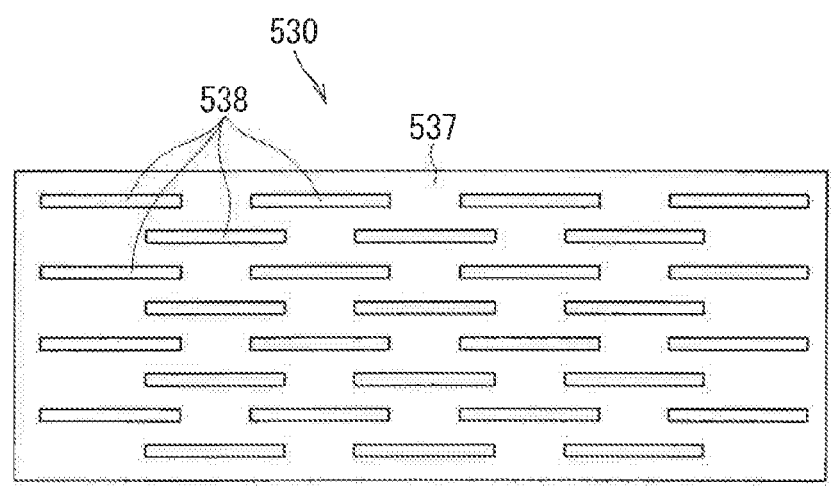

WIRE HARNESS

TECHNICAL FIELD

The present invention relates to a technique of attaching electric wires to an exterior component in a wire harness for vehicle.

BACKGROUND ART

Patent Document 1 discloses a technique, when a sheet-shaped exterior component is attached to electric wires, for positioning the exterior component with respect to the electric wires by winding a tape around each terminal portion of the exterior component and the electric wires protruding from the terminal portion.

PRIOR ART DOCUMENTS

Patent Documents

Patent Document 1: Japanese Patent Application Laid-Open No. 2015-72798

SUMMARY

Problem to be Solved by the Invention

Also, an adhesive, for example, is considered as a general technique of attaching the electric wires to the exterior component. However, the other component such as the tape or the adhesive is necessary in these methods.

An object of the present invention is to provide a technique capable of omitting the other component such as the tape or the adhesive in attaching the exterior component to the electric wires.

Means to Solve the Problem

In order to solve the above problem, a wire harness according to a first aspect includes: a functional exterior component shaped into a sheet; and an electric wire disposed to overlap with the functional exterior component in at least a part of a region along a longitudinal direction, wherein at least a part of an overlap between an insulating covering of the electric wire and the functional exterior component is welded.

A wire harness according to a second aspect is the wire harness according to the first aspect, wherein at least a part of the overlap between the insulating covering of the electric wire and the functional exterior component is ultrasonic-welded.

A wire harness according to a third aspect is the wire harness according to the second aspect, wherein a mark made by pressing a horn of an ultrasonic welding machine is left on a surface located on an opposite side of a surface on which the electric wire is disposed in the functional exterior component.

A wire harness according to a fourth aspect is the wire harness according to any one of the first to third aspects, wherein the functional exterior component includes a soundproof component with soundproof properties.

A wire harness according to a fifth aspect is the wire harness according to any one of the first to fourth aspects, wherein the functional exterior component includes a shielding component capable of shielding the electric wire.

A wire harness according to a sixth aspect is the wire harness according to any one of the first to fifth aspects, wherein the functional exterior component includes a protective component having abrasion resistance and capable of protecting the electric wire from abrasion.

A wire harness according to a seventh aspect is the wire harness according to any one of the first to sixth aspects, wherein the functional exterior component includes a heat radiating component capable of radiating heat of the electric wire.

A wire harness according to an eighth aspect is the wire harness according to the seventh aspect, wherein a high emission ratio portion having higher emission ratio than an inner portion of the heat radiating component is formed on a surface of the heat radiating component.

A wire harness according to a ninth aspect is the wire harness according to any one of the first to eighth aspects, wherein the functional exterior component functions as a tension member subjected to tensile force applied to the electric wire.

A wire harness according to a tenth aspect is the wire harness according to any one of the first to ninth aspects, wherein in the functional exterior component, a tensile strength in a direction along an extension direction of the electric wire is higher than a tensile strength in a direction orthogonal to the direction along the extension direction.

A wire harness according to an eleventh aspect is the wire harness according to any one of the first to tenth aspects, wherein the functional exterior component includes a waterproof component with waterproof properties.

A wire harness according to a twelfth aspect is the wire harness according to any one of the first to eleventh aspects, wherein a connector provided at an end of the electric wire is welded to the functional exterior component.

A wire harness according to a thirteenth aspect is the wire harness according to any one of the first to twelfth aspects, wherein a fastening component for fastening the electric wire to a mounting object is welded to the functional exterior component.

Effects of the Invention

According to the first to thirteenth aspects, the exterior component and the electric wire can be directly fastened to each other by welding. Accordingly, the other component such as a tape or an adhesive can be omitted in attaching the exterior component to the electric wire.

Particularly, according to the second aspect, the welding is easily performed.

Particularly, according to the third aspect, the horn of the ultrasonic welding machine comes in contact with the exterior component, thus the electric wire is hardly damaged.

Particularly, according to the fourth aspect, a soundproof structure can be easily given.

Particularly, according to the fifth aspect, the electric wire can be easily shielded.

Particularly, according to the sixth aspect, the electric wire can be easily protected.

Particularly, according to the seventh aspect, heat of the electric wire can be easily radiated.

Particularly, according to the eighth aspect, the heat radiation effect can be enhanced.

Particularly, according to the ninth aspect, the electric wire is hardly damaged even with application of the tensile force to the wire harness.

Particularly, according to the tenth aspect, the functional exterior component hardly ruptures even with application of the tensile force to the wire harness.

Particularly, according to the eleventh aspect, the electric wire can be easily waterproofed.

Particularly, according to the twelfth aspect, the connector can be easily positioned.

Particularly, according to the thirteenth aspect, the fastening component can be easily attached.

BRIEF DESCRIPTION OF DRAWINGS

FIG. 1 A perspective view of a wire harness according to a first embodiment.

FIG. 2 A bottom view of the wire harness according to the first embodiment.

FIG. 9 A schematic cross-sectional view of a modification example of a functional exterior component.

FIG. 10 A schematic plan view of another modification example of the functional exterior component.

DESCRIPTION OF EMBODIMENT(S)

First Embodiment

Figure 3:
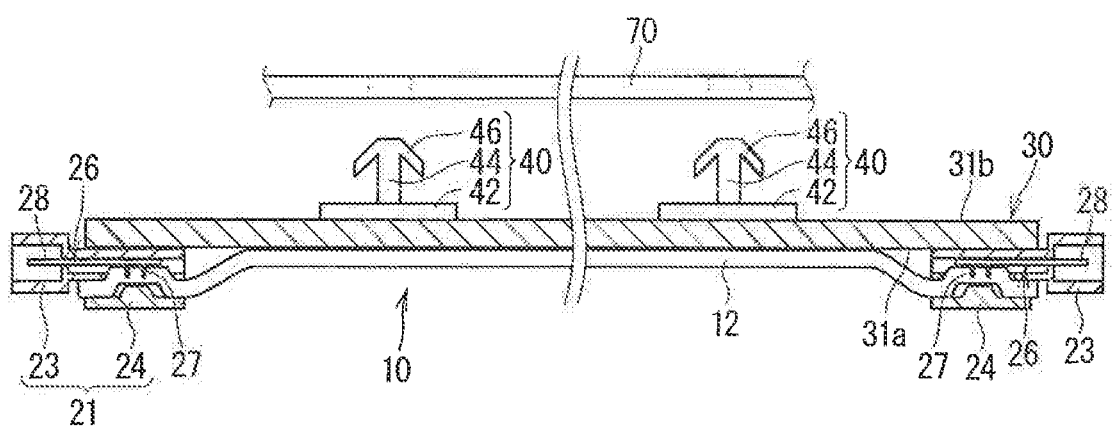
FIG. 3 A schematic cross-sectional view of the wire harness cut along a III-III line in FIG. 2.

A wire harness according to a first embodiment is described hereinafter. FIG. 1 is a perspective view of a wire harness 10 according to the first embodiment. FIG. 2 is a bottom view of the wire harness 10 according to the first embodiment. FIG. 3 is a schematic cross-sectional view of the wire harness 10 cut along a III-III line in FIG. 2.

The wire harness 10 is used as a wiring for electrically connecting various electrical devices mounted on, for example, a vehicle. The wire harness 10 is routed around, for example, an installment panel, a roof, and a door in the vehicle. Specifically, the wire harness 10 includes a functional exterior component 30 and electric wires 12. The wire harness 10 further includes connectors 20 and fastening components 40.

The functional exterior component 30 is shaped into a sheet. As illustrated in FIG. 1, the functional exterior component 30 is shaped into a rectangular sheet. The shape of the functional exterior component 30 is not limited to the aforementioned shape, but can be appropriately changed according to, for example, the placement of the electric wires 12. The functional exterior component 30 is a component in which the electric wires 12 are covered. The functional exterior component 30 is a component having at least one of functions of soundproofing (sound-damping, sound absorption, sound insulation, etc.), protection (abrasion resistance, tensile resistance, penetration resistance, etc.), heat radiation, shielding, waterproofing, etc. for the electric wires 12. An appropriate one of the functions of the functional exterior component 30 is selected according to, for example, the properties of the electric wires 12 and an environment of a portion on which the electric wires 12 are disposed. Since the electric wires 12 are disposed in a portion that may rub against the surrounding components, an example where the functional exterior component 30 is a protective sheet (protective component) with abrasion resistance will be described.

The protective sheet is formed of a sheet material such as polyvinyl chloride (PVC), polyethylene (PE), polypropylene (PP), or a nonwoven fabric. When the protective sheet is formed of a nonwoven fabric, the protective sheet may be, for example, hot-pressed. A spunbond nonwoven fabric on which emboss processing is performed may also be applicable. Consequently, the protective sheet can be hardened. The abrasion resistance of the protective sheet may be obtained from physical properties of its structure or from physical properties of a raw material. Although the protective sheet is formed flat in the example illustrated in FIG. 1, an application of a structure having protrusions and depressions on an external surface of this protective sheet will be able to increase the abrasion resistance of the protective sheet. For another example, an application of a structure with the nonwoven fabric hot-pressed will be able to harden the protective sheet and increase the abrasion resistance. For another example, an application of a hard raw material as a material for the protective sheet will be able to increase the abrasion resistance.

The electric wires 12 are disposed to overlap with the functional exterior component 30 in at least a part of a region along a longitudinal direction. In the example illustrated in FIG. 1, the electric wires 12 are disposed only on a side of one main surface 31a of the functional exterior component 30, but may halfway transfer to a side of the other main surface 31b. The number of the electric wires 12 may be at least one. Herein, the number of the electric wires 12 is two or more (three in the example illustrated in FIG. 1). Adopted as the electric wires 12 are insulated electric wires 12 each including a core wire 14 and an insulating covering 16 for covering the core wire 14 (see FIG. 7). The core wire 14 is made of a conductive material such as copper or aluminum. The core wire 14 may be a solid wire or a stranded wire. The insulating covering 16 may be formed by extrusion molding, for example, a resin such as polyvinyl chloride (PVC), polyethylene (PE), polypropylene (PP) around the core wire 14 or by applying, for example, varnish around the core wire 14 and baking the varnish.

At least a part of an overlap between the insulating covering 16 of the electric wires 12 and the functional exterior component 30 is welded. Thus, the electric wires 12 and the functional exterior component 30 are fastened to each other.

Figure 4:
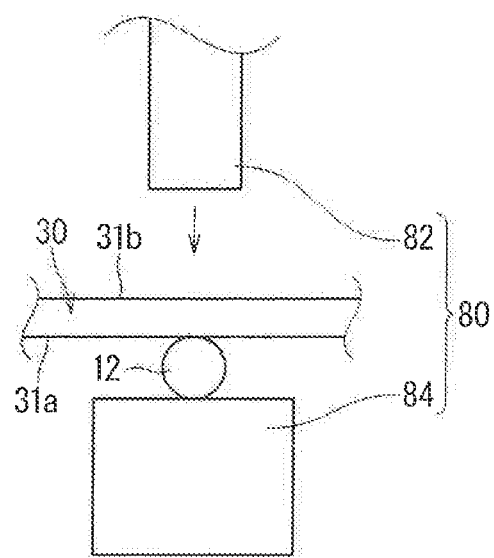
FIG. 4 An explanation drawing of an implementation of ultrasonic welding.

Ultrasonic welding is adopted herein as the welding means. FIG. 4 is an explanation drawing of an implementation of the ultrasonic welding. As illustrated in FIG. 4, the ultrasonic welding is generally performed by sandwiching two components (the electric wires 12 and the functional exterior component 30 herein) to be welded to each other between a horn 82 and an anvil 84 in an ultrasonic welding machine 80. The two components are located between the horn 82 and the anvil 84 so that surfaces of the two components to be welded are in direct contact with each other.

The horn 82 is in direct contact with one component in the two components, and provides the one component with ultrasonic vibration. Examples of a transmission form of the ultrasonic vibration from the horn 82 include longitudinal vibration and lateral vibration, for example, however, the transmission form can be appropriately selected in accordance with shapes and physical properties of components to be welded.

The anvil 84 supports the other component in the two components, in the example illustrated in FIG. 4, an electric wire supporting surface of the anvil 84 is formed to have a flat surface, but may also be formed to have a curved surface.

When the ultrasonic vibration is applied from the horn 82 to the one component while the two components to be welded are sandwiched between the horn 82 and the anvil 84, a friction or compression occurs due to the applied ultrasonic vibration, and heat energy is generated. Accordingly, a part of a direct contact surface is melted by the heat energy, and the two components are bonded. Only one of the two components may be melted, or both of the two components may be melted. It is considered to be determined in accordance with physical properties of materials constituting the two components, for example.

In the example illustrated in FIG. 4, the horn 82 comes in direct contact with the other main surface 31b of the functional exterior component 30 to apply the ultrasonic vibration to the functional exterior component 30. Herein, in the ultrasonic welding, a mark made by pressing the horn 82 (referred to as a horn mark 34 hereinafter) may be generally left on the component. Accordingly, the horn mark 34 may also be left in the wire harness 10. Herein, the horn 82 is in direct contact with the other main surface 31b of the functional exterior component 30, thus the horn mark 34 is considered to be left on the other main surface 31b of the functional exterior component 30 as illustrated in FIG. 2. It is considered that the horn mark 34 has a shape corresponding to a concave-convex shape formed on the horn 82, for example. It is not necessary to make the horn 82 come in direct contact with the other main surface 31b of the functional exterior component 30, however, the horn 82 may come in direct contact with the electric wires 12 to apply the ultrasonic vibration to the electric wires 12. In this case, the horn mark is considered to be left on the electric wires 12. However, when the horn 82 comes in direct contact with the other main surface 31b of the functional exterior component 30, damage on the electric wires 12 can be suppressed in the ultrasonic welding process.

A region of the electric wires 12 welded to the functional exterior component 30 in a longitudinal direction may seamlessly extend along the longitudinal direction of the electric wires 12 in series, or may include a section partially disconnected along the longitudinal direction of the electric wires 12. In the example illustrated in FIG. 2, the ultrasonic welding is intermittently performed to include the section partially disconnected along the longitudinal direction of the electric wires 12. At this time, a range of one welding point and an interval of the adjacent welding points, for example, may be appropriately set in accordance with a bonding strength, for example. In the example illustrated in FIG. 2, the ultrasonic welding is intermittently performed at a constant pitch along the longitudinal direction of the electric wires 12, however, there may also be a part where the ultrasonic welding is performed at a different pitch.

A region of the electric wires 12 welded to the functional exterior component 30 in a circumferential direction may be a whole region along the circumferential direction, or may be a part of the region. In the case where the part of the region of the electric wires 12 along the circumferential direction is welded, the region may be equal to or smaller than a half of the circumference, or may be equal to or smaller than a quarter of the circumference.

In performing the ultrasonic welding, at least one of the two components (herein, the insulating covering 16 of the electric wires 12 and the functional exterior component 30) includes a thermoplastic resin on the direct contact surface. At this time, it is preferable that both the two components include thermoplastic resins on their direct contact surfaces each having a similar degree of melting point. Furthermore, it is more preferable that both the two components include the same thermoplastic resin on their direct contact surfaces. Accordingly, both the two components are melted, and the bonding strength can be increased.

The electric wires 12 may be power wires or signal wires regarding a usage. The electric wires 12 may be thick or thin regarding a thickness. The electric wires 12 may be round wires or angular wire regarding a cross-sectional shape. Herein, it is preferable that each of the direct contact surfaces of the two components at the time of starting the ultrasonic welding generally has a convex shape to reduce a contact area. From this point of view, the round wire has the convex shape in any position in the circumferential direction, thus an arrangement direction needs not be considered. Accordingly, the round wire has a shape suitable for the ultrasonic welding.

Ends of the electric wires 12 are incorporated in the connectors 20. While the wire harness 10 is disposed in a target portion in a vehicle, etc., the connectors 20 are connected to connectors of the various electrical devices mounted on the vehicle, for example. Consequently, the wire harness 10 is used as the wiring for electrically connecting the various electrical devices mounted on the vehicle, for example.

Herein, the connectors 20 are also welded to the functional exterior component 30. A part of an outer surface of a connector housing 21 in the connectors 20 has an overlap with the functional exterior component 30, and at least a part of the overlapped portion is welded. The connector housing 21 is a component integrally molded (injection-molded) using a resin as a material, for example. In the example illustrated in FIG. 2, the horn mark 34 is left on a side of the functional exterior component 30, however, the horn mark may be left on a side of the connector housing 21.

A welding point in the connector housing 21 is preferably a point which does not block a fit to a partner connector. For example, in the example illustrated in FIG. 2, a peripheral part of a portion from which the electric wires 12 extend outside in the connector housing 21 is welded, however, it is also applicable that a part of the outer surface of the connector housing 21 is protruded to provide a protrusion piece, and the protrusion piece is welded.

It is not necessary that the connectors 20 are welded to the functional exterior component 30. In this case, the connector 20 may or may not be fastened to the functional exterior component 30 with another means such as an adhesive tape or an adhesive.

Herein, as illustrated in FIG. 3, the connectors 20 are the connectors 20 of insulation-displacement type. More specifically, the connector housing 21 is made up of a first component 23 and a second component 24 that can be incorporated into the first component 23.

The first component 23 can hold an insulation-displacement contact 26 with an insulation-displacement part 27 exposed outside. The insulation-displacement part 27 is included in the insulation-displacement contact 26, and can be connected to the insulated electric wires 12 with pressure. The first component 23 houses a partner joint 28 to be connected to a partner conductor, with the partner conductor connectable. The partner joint 28 is included in the insulation-displacement contact 26. The second component 24 is disposed opposite to a portion of the first component 23 for holding the insulation-displacement part 27, and can press the insulated electric wires 12 toward the insulation-displacement part 27. The second component 24 presses the insulated electric wires 12 toward the insulation-displacement part 27, while the insulated electric wires 12 are located on the insulation-displacement part 27 in the insulation-displacement contact 26 held by the first component 23 without being peeled off. Consequently, a part of the insulation-displacement part 27 breaks the insulation covering 16 of the insulated electric wires 12 to abut and be electrically connected to the core wire 14.

Herein, all the three electric wires 12 are welded to the functional exterior component 30 in the example illustrated in FIG. 2. When the number of the electric wires 12 included in the wire harness 10 is two or more, the electric wires 12 may include the electric wires 12 that are not welded to the functional exterior component 30. The three electric wires 12 are welded in the similar manner in the example illustrated in FIG. 2. When the wire harness 10 includes the plurality of electric wires 12 welded to the functional exterior component 30, at least some of the welding forms such as a welding means and a welding region may be different between the welded electric wires 12.

The three electric wires 12 are connected to the same connectors 20 in the example illustrated in FIG. 1. When the number of the electric wires 12 included in the wire harness 10 is two or more, the electric wires 12 may include the electric wires 12 that are connected to the different connectors 20.

The electric wires 12 are linearly disposed in the example illustrated in FIG. 1. The electric wires 12 may be curved. When the number of the electric wires 12 included in the wire harness 10 is two or more, the electric wires 12 linearly disposed and the electric wires 12 that are curved may coexist. In this case, the plurality of the electric wires 12 may have branches on the functional exterior component 30.

The electric wires 12 are disposed close to a center of the functional exterior component 30 in a width direction in the example illustrated in FIG. 1. A route along which the electric wires 12 are disposed with respect to the functional exterior component 30 is not limited thereto described above. The electric wires 12 may be disposed, for example, close to an end of the functional exterior component 30 in the width direction. The electric wires 12 may, for example, extend diagonally to the functional exterior component 30.

The fastening components 40 are components for fastening the electric wires 12 to a mounting object 70 such as a car body panel or a rod component. Herein, the fastening components 40 are also welded to the functional exterior component 30. In the example illustrated in FIG. 2, the horn mark 34 is left on the side of the functional exterior component 30, however, the horn mark may be left on a side of the fastening components 40. Herein, the fastening components 40 are components referred to as clamps or clips, each including a pillar part 44 and a wing part 46 extending from a tip of the pillar part 44 and integrally molded (injection-molded) using a resin as a material, for example. A plate part 42 supporting the pillar part 44 is provided in the fastening component 40, and the plate part 42 and the functional exterior component 30 are welded to each other. As the plate part 42, an existing component such as a protrusion piece tape-wound in a so-called tape-wound clump may be used, for example, or a new dedicated component may also be used.

In the example illustrated in FIG. 2, the fastening components 40 are attached to protrude on a side of the other main surface 31b which is located on an opposite side of the one main surface 31a on which the electric wires 12 are disposed. Accordingly, the direct contact of the electric wires 12 with the mounting object 70 is suppressed, thus the electric wires 12 can be protected from the mounting object 70. The fastening components 40 may be attached to protrude on the side of the one main surface 31a.

According to the wire harness 10 having the configuration described above, the exterior component 30 and the electric wires 12 can be directly fastened to each other by welding. Accordingly, the other component such as the tape or the adhesive can be omitted in attaching the exterior component 30 to the electric wires 12.

At least the part of the overlap between the insulating covering 16 of the electric wires 12 and the functional exterior component 30 is ultrasonic-welded, thus the welding is easily performed.

The horn 82 of the ultrasonic welding machine 80 comes in contact with the exterior component 30, thus the electric wires 12 are hardly damaged. At this time, the horn mark 34 made by pressing the horn 82 of the ultrasonic welding machine 80 is left on a surface (the other main surface 31b in the example illustrated in FIG. 1) located on an opposite side of a surface on which the electric wires 12 are disposed (the one main surface 31a in the example illustrated in FIG. 1) in the functional exterior component 30.

Since the functional exterior component 30 has abrasion resistance, the electric wires 12 can be easily protected.

Since the connectors 20 provided at the ends of the electric wires 12 are also welded to the functional exterior component 30, the connectors 20 can be easily positioned.

Since the fastening components 40 for fastening the electric wires 12 to the mounting object 70 are welded to the functional exterior component 30, the fastening components 40 can be easily attached.

Second Embodiment

Figure 5:
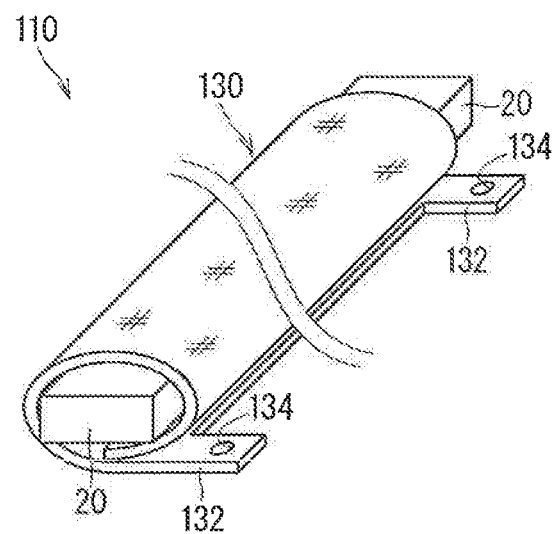
FIG. 5 A schematic perspective view of a wire harness according to a second embodiment.

Next, a wire harness 110 according to a second embodiment will be described. FIG. 5 is a schematic perspective view of the wire harness 110 according to the second embodiment. In the following description of each embodiment, the same reference numerals are assigned to the same constituent elements described above, and the description thereof will be omitted.

The wire harness 110 according to the second embodiment differs from the wire harness 10 according to the first embodiment in that a functional exterior component 130 is a shielding component having shielding properties.

The shielding component is formed from, for example, a metal foil, a metal mesh, a laminated component of a metal foil and a resin sheet, or a sheet material made of a conductive resin. In a case where a metal component such as the metal foil or the metal mesh comes in direct contact with the electric wires 12, it is considered that only the insulating covering 16 is melted and welded to the metal foil or the metal mesh, for example.

Herein, the shielding component is flexible to the extent that it can be wound around the electric wires 12. The shielding component is wound around the electric wires 12 to cover the surrounding of the electric wires 12 with the shielding component and the electric wires 12 fastened to each other by welding. This enables the shielding component to shield the electric wires 12 inside. The shielding component has fixed pieces 132 each with a screw hole 134.

The shielding component is grounded with the fixed pieces 132 being fixed to, for example, a car body panel with bolts. The grounding method may include withdrawing a drain line abutting the shielding component or electrically conducting a part of the electric wires 12 fastened to the shielding component to use the part of the electric wires 12 as a drain line.

The electric wires 12 can be easily shielded in the wire harness 110 with such a configuration.

Third Embodiment

Figure 6:
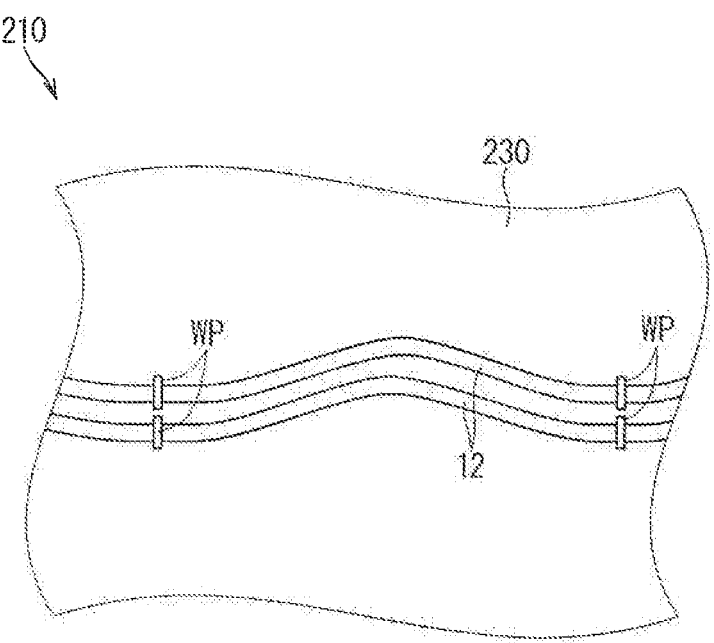
FIG. 6 A partial enlarged plan view of a wire harness according to a third embodiment.

Next, a wire harness 210 according to a third embodiment will be described. FIG. 6 illustrates a partial enlarged plan view of the wire harness 210 according to the third embodiment.

The wire harness 210 according to the third embodiment differs from the wire harness 10 according to the first embodiment in that a functional exterior component 230 is a tension member subjected to tensile force applied to the electric wires 12.

For example, considered is a configuration that a sheet material that is less stretchable than the electric wires 12 is adopted as the functional exterior component 230, and the part of the electric wires 12 fastened to the functional exterior component 230 slacks as illustrated in FIG. 6. For example, considered is that the electric wires 12 and the functional exterior component 230 are intermittently welded along the longitudinal direction, and the electric wires 12 slacks in a portion between the adjacent welding points. This enables the functional exterior component 230 to receive the tensile force applied to the wire harness 210 along the longitudinal direction of the electric wires 12. As a result, it is possible to suppress the excessive tensile force applied to the electric wires 12. In FIG. 6, partial welding points WP are exaggeratingly shown by square-shaped graphics.

The electric wires 12 are hardly damaged even with application of the tensile force to the wire harness 210 with such a configuration.

Fourth Embodiment

Figure 7:
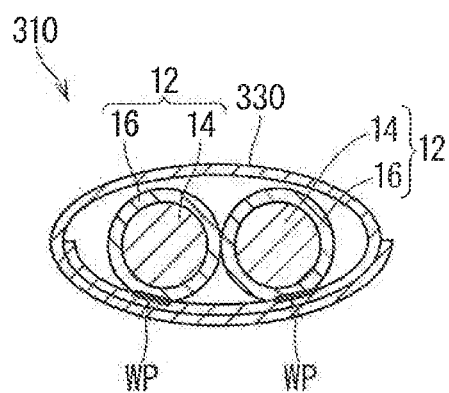
FIG. 7 A schematic cross-sectional view of a wire harness according to a fourth embodiment.

Next, a wire harness 310 according to a fourth embodiment will be described. FIG. 7 is a schematic cross-sectional view of the wire harness 310 according to the fourth embodiment. Note that FIG. 7 is a cross-sectional view of the wire harness 310 cut in a plane orthogonal to the longitudinal direction of the electric wires 12.

The wire harness 310 according to the fourth embodiment differs from the wire harness 10 according to the first embodiment in that a functional exterior component 330 is a waterproof sheet with waterproof properties.

The waterproof sheet is, for example, a polyethylene sheet. The waterproof sheet is flexible to the extent that it can be wound around the electric wires 12. The waterproof sheet covers around the electric wires 12, with the electric wires 12 and the waterproof sheet welded to each other. This prevents, for example, water from entering the inside of the waterproof sheet. In the example illustrated in FIG. 7, the waterproof sheet has a part not being welded but covering the welding point WP, however, this configuration is not necessary. A winding end portion of the waterproof sheet may be fixed by, for example, an adhesive tape or an adhesive without having any gap. It is not necessary that the waterproof sheet covers an entire periphery of the electric wires 12. For example, the waterproof sheet may be disposed only on one surface side of the electric wires 12 to prevent the electric wires 12 from getting water from one side. In this case, the waterproof sheet needs not be flexible to the extent that it can be wound around the electric wires 12.

The electric wires 12 can be easily waterproofed in the wire harness 310 with such a configuration.

Fifth Embodiment

Figure 8:
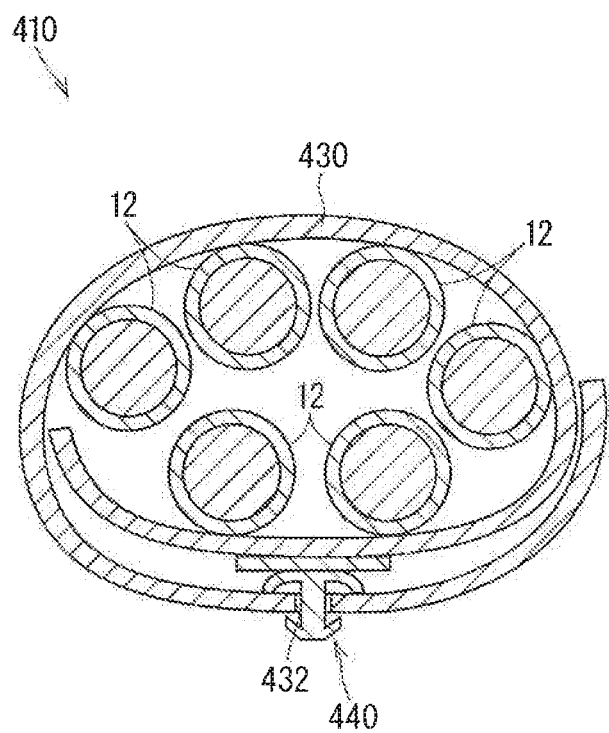
FIG. 8 A schematic cross-sectional view of a wire harness according to a fifth embodiment.

Next, a wire harness 410 according to a fifth embodiment will be described. FIG. 8 is a schematic cross-sectional view of the wire harness 410 according to the fifth embodiment.

The wire harness 410 according to the fifth embodiment differs from the wire harness 10 according to the first embodiment in that a functional exterior component 430 is wound around the electric wires 12 and a fastening component 440 maintains the winding state.

In this case, in the functional exterior component 430, a through hole 432 into which a fastening portion of the fastening component 440 can be inserted may be formed in a portion having an overlap with a portion in which the fastening component 440 is provided.

The winding state of the functional exterior component 430 can be easily maintained in the wire harness 410 with such a configuration.

Modification Example

In the above description, the welding means is the ultrasonic welding, however, the welding means is not limited to the ultrasonic welding. For example, a thermal welding such as a resistance welding or a laser welding may also be applicable.

Although the first embodiment describes that the protective sheet has abrasion resistance, this is not necessary. The protective sheet may have penetration resistance. In this case, the protective sheet may have the penetration resistance needed under a usage environment in a vehicle.

Although the first embodiment describes that the functional exterior component 30 is a protective sheet, this is not necessary. The functional exterior component 30 may be a soundproof sheet (soundproof component). The soundproof sheet is, for example, a sheet component made of a nonwoven fabric or a foamed resin. When the functional exterior component 30 is a soundproof sheet, a structure for enclosing the electric wires 12 welded to the functional exterior component 30 with the soundproof sheet is also applicable. This can improve the soundproof properties. The soundproof sheet may be folded to enclose the electric wires 12, or a soundproof sheet to which the electric wires 12 are welded and a soundproof sheet separately provided from the former soundproof sheet may sandwich the electric wires 12.

Although the second embodiment describes that the functional exterior component 130 is made of a metal, the functional exterior component 130 made of a metal may be used not as a shielding component but as a heat radiating component. When the functional exterior component 130 is used as a heat radiating component, considered is a configuration that the functional exterior component 130 and the electric wire 12 abut at least in a part of a region, and at least a part of a region of the functional exterior component 130 is exposed outside.

When the functional exterior component 130 is used as a heat radiating component, metals are generally superior in thermal conductivity but often inferior in emission ratio (may be referred to as emissivity). Thus, high emission ratio portions 138 may be formed on the surfaces of the functional exterior component 130 as illustrated in FIG. 9. The high emission ratio portions 138 are portions with the emission ratio higher than that of an inner portion 137.

According to Wien's displacement law, the peak wavelength of light emitted from an object through thermal radiation is inversely proportional to the temperature of the object. It is also known that the same material may have different values of the emission ratios, depending on the temperature of the object (wavelength of light). Since it is desired to increase the emission ratio of the wire harness 110 to be mounted on a vehicle, the high emission ratio portions 138 may have a higher emission ratio to correspond to the peak wavelength in a high temperature zone generated in a usage environment of the vehicle.

A surface treatment for increasing the emission ratio is applied to the surfaces of the functional exterior component 130 to form the high emission ratio portions 138. Considered is that the high emission ratio portions 138 is, for example, oxide films formed by oxidizing the metal surfaces of the inner portion 137. The high emission ratio portions 138 may be, for example, plated portions or painted portions subjected to a plating process or a painting process, respectively, on the surface of a component of the inner portion 137. The paint to be used in the painting process may be, for example, a resin.

Although the high emission ratio portions 138 are formed on both of the main surfaces of the functional exterior component 130 in the example illustrated in FIG. 9, the high emission ratio portion 138 may be formed only on one of the main surfaces thereof. When the high emission ratio portion 138 is formed only on one of the main surfaces of the functional exterior component 130, it may be formed on the main surface on which the electric wires 12 are disposed or on the opposite main surface thereof. The high emission ratio portion 138 may be formed over the entire region of the main surface of the functional exterior component 130 or only on a part of the region thereof. When the high emission ratio portion 138 is formed only on a part of the region of the main surface of the functional exterior component 130, it may be or may not be formed on a portion on which the electric wires 12 are disposed. The high emission ratio portion 138 may be preferably formed on an outward plane of the functional exterior component 130. When the high emission ratio portion 138 is formed on a portion of the functional exterior component 130 where heat dissipation cannot be expected from conduction or convection with the wire harness 110 being mounted on a vehicle, the high emission ratio portion 138 is more effective at dissipating heat from the portion.

Formation of the high emission ratio portion enables more efficient heat radiation. Since the temperature rise in the electric wires 12 can be suppressed lower, the electric wires 12 can be downsized. Since the necessary amount of heat storage can be reduced as the amount of heat radiation in the functional exterior component 130 increases, the functional exterior component 130 can be thinned.

The functional exterior component 30 may have different tensile strengths in first and second directions that are orthogonal to each other, among spreading directions of the main surface of the functional exterior component 30. In this case, the direction with a higher tensile strength is preferably equal to the extension direction of the electric wires 12 in the functional exterior component 30. This is because when the wire harness 10 is mounted on a vehicle, the functional exterior component 30 may be pulled toward the extension direction of the electric wires 12 more than being pulled toward the direction orthogonal to the extension direction of the electric wires 12, and the tensile force of the former pulling may be higher than that of the latter pulling. Since particularly, making the direction with a higher tensile strength equal to the extension direction of the electric wires 12 enables the wire harness 10 to be hardly damaged even when the wire harness 10 is strongly pulled toward the extension direction, the wire harness 10 is easily mounted on the vehicle. For example, the functional exterior component 30 with such anisotropy in the tensile strength is suitable as the functional exterior component 230 according to the third embodiment to be used as a tension member.

The functional exterior component 30 may be any as long as the tensile strengths in the first and second directions are different. Any material and manufacturing method, etc. are applicable. For example, the functional exterior component 30 with the different tensile strengths in the first and second directions may be obtained by drawing, during manufacture, a sheet material formed by extrusion molding, such as a uniaxially oriented film or a biaxially oriented film. Filament nonwoven fabrics such as spunbond nonwoven fabrics normally have a high tensile strength in a fiber elongation direction.

As illustrated in FIG. 10, the functional exterior component 30 may have, for example, an additional shape with the different tensile strengths in the first and second directions. In the example of a functional exterior component 530 illustrated in FIG. 10, altering the shape of compressed portions 538 yields the different tensile strengths. More specifically, the functional exterior component 530 subjected to the compression processing such as embossing includes the compressed portions 538 that are more compressed than a surrounding portion 537. At this time, the compressed portions 538 are each formed with longer sides, such as rectangles or ovals. In this case, in the functional exterior component 530, the tensile strength of the compressed portions 538 along a longitudinal direction is considered to be higher than the tensile strength of the compressed portions 538 along a short-side direction.

In the example illustrated in FIG. 10, a plurality of the compressed portions 538 are formed in alignment in vertical and horizontal directions on the plane of the paper sheet. In each of the directions, the plurality of the compressed portions 538 are oriented toward the same direction. More specifically, the plurality of the compressed portions 538 are aligned so that the short-side direction is equal to the vertical direction on the plane of the paper sheet. The plurality of the compressed portions 538 are also aligned so that the longitudinal direction is equal to the horizontal direction on the plane of the paper sheet. In this case, the functional exterior component 530 may have the compressed portions 538 at least in a position of an intermediate portion along the horizontal direction on the plane of the paper sheet, in any position along the horizontal direction on the plane of the paper sheet as illustrated in FIG. 10, and at least in a part of a region along the vertical direction on the plane of the paper sheet in that position. This is because if the compressed portions 538 are not formed in the position of the intermediate portion of the functional exterior component 530 along the horizontal direction on the plane of the paper sheet and along the vertical direction on the plane of the paper sheet in that position, the stress may concentrate on the intermediate portion with application of the tensile force to the functional exterior component 530 in the horizontal direction on the plane of the paper sheet.

The functional exterior component 30 may have different stretchabilities in the first and second directions described above. When the electric wires 12 are disposed to linearly extend in a portion on which the functional exterior component 30 is attached, the direction in which the functional exterior component 30 is less stretchable is preferably equal to the extension direction of the electric wires 12. This makes it easier to maintain the electric wires 12 linearly extended. The proportion of the functional exterior component 30 for bearing the load of a part of the tensile force applied to the electric wires 12 increases as the electric wires 12 are less stretchable. Thus, it is possible to expect an advantage of the functional exterior component 30 functioning as a tension member. Since the electric wires 12 can be wound in a direction in which the functional exterior component 30 is more stretchable when the functional exterior component 30 is wound around the electric wires 12 or when the functional exterior component 30 is wound around a rod component for reinforcement with the electric wires 12 laid along the rod component, the electric wires 12 are easily wound.

When the electric wires 12 are disposed to extend with a bend in a portion on which the functional exterior component 30 is attached, the direction in which the functional exterior component 30 is more stretchable is preferably equal to the extension direction of the electric wires 12. This allows the functional exterior component 30 to follow the bend of the electric wires 12.

The functional exterior component 30 may be any as long as the stretchabilities in the first and second directions are different. Any material and manufacturing method, etc. are applicable. For example, the functional exterior component 30 with the different stretchabilities in the first and second directions may be obtained by drawing, during manufacture, a sheet material formed by extrusion molding, such as a uniaxially oriented film or a biaxially oriented film. Filament nonwoven fabrics such as spunbond nonwoven fabrics are normally more stretchable in a direction intersecting with a fiber elongation direction.

The functional exterior component 30 may, for example, have an additional shape with the different stretchabilities in the first and second directions. In the example of the functional exterior component 530 illustrated in FIG. 10 described above, the compressed portions 538 with the aforementioned shape in the vertical direction on the plane of the paper sheet will be more stretchable than that in the horizontal direction on the plane of the paper sheet.

In the first and second directions, the direction with a higher tensile strength may be equal to or different from the direction with less stretchability. In the first and second directions, different tensile strengths with the same stretchability, or the same tensile strength with different stretchabilities may be exhibited.

In the above description, the insulating covering 16 covering immediately around the core wire 14 in one electric wire 12 is directly welded to the functional exterior component 30, however, this configuration is not necessary. For example, also considered is that in an electric wire including a plurality of insulating coverings such as one shielding electric wire which includes a core wire, a first insulating covering covering the core wire, a shielding layer covering the first insulating covering, and a second insulating covering covering the shielding layer, the second insulating covering which is an outermost layer and a functional exterior component are welded to each other. Also considered, for example, is that in a cable including a plurality of electric wires 12 and a sheath covering around the plurality of electric wires 12, the sheath and a functional exterior component are welded to each other. In this case, the sheath can be considered as one of the insulating coverings in the electric wires 12.

Although application of the insulation-displacement connectors 20 as the connectors 20 is described above, this is not necessary. The connectors may, for example, house terminals connected to the ends of the electric wires 12.

The configurations described in the embodiments and modification examples thereof can be appropriately combined as long as they are not contradictory. For example, a functional exterior component may be a combination of a plurality of sheet materials with different functions.

Although the present invention is described in detail, the foregoing description is in all aspects illustrative and does not restrict the invention. It is therefore understood that numerous modifications and variations can be devised without departing from the scope of the invention.

EXPLANATION OF REFERENCE SIGNS 10 wire harness
12 electric wire
14 core wire
16 insulating covering
20 connector
21 connector housing
23 first component
24 second component
26 insulation-displacement contact
27 insulation-displacement part
30 functional exterior component
31a one main surface
31b other main surface
34 horn mark
40 fastening component
42 plate part
44 pillar part
46 wing part
80 ultrasonic welding machine
82 horn
84 anvil

What is claimed is:
1. A wire harness, comprising:
a functional exterior component shaped into a sheet having a first end and a second end; and
an electric wire disposed to overlap with the functional exterior component in at least a part of a region along a longitudinal extension direction of the electric wire from the first end to the second end, wherein
at least a part of an overlap between an insulating covering of the electric wire and the functional exterior component is welded,
a first connector and a second connector are welded to the functional exterior component on a surface on which the electric wire is disposed, at the first end and the second end of the electric wire, such that ends of the electric wire are incorporated into the first connector and the second connector, and
the functional exterior component includes welding horn marks on a surface located on an opposite side of the surface on which the electric wire is disposed in the functional exterior component, and each of the welding horn marks includes a shape corresponding to a shape formed on a horn of a welding machine that welds the at least the part of the overlap, and the welding horn marks are spaced apart from one another in a direction along the longitudinal extension direction of the electric wire and are disposed to overlap with the electric wire.

2. The wire harness according to claim 1, wherein
at least a part of the overlap between the insulating covering of the electric wire and the functional exterior component is ultrasonic-welded.

3. The wire harness according to claim 2, wherein
each of the welding horn marks is a mark made by pressing the horn, which is a horn of an ultrasonic welding machine, on the surface located on the opposite side of the surface on which the electric wire is disposed in the functional exterior component.

4. The wire harness according to claim 1, wherein
the functional exterior component includes a soundproof component with soundproof properties.

5. The wire harness according to claim 1, wherein
the functional exterior component includes a shielding component to shield the electric wire.

6. The wire harness according to claim 1, wherein
the functional exterior component includes a protective component having abrasion resistance and that is to protect the electric wire from abrasion.

7. The wire harness according to claim 1, wherein
the functional exterior component includes a heat radiating component to radiate heat of the electric wire.

8. The wire harness according to claim 7, wherein
a high emission ratio portion having higher emission ratio than an inner portion of the heat radiating component is formed on a surface of the heat radiating component.

9. The wire harness according to claim 1, wherein
the functional exterior component functions as a tension structure subjected to a tensile force applied to the electric wire.

10. The wire harness according to claim 1, wherein
in the functional exterior component, a tensile strength in a direction along the longitudinal extension direction of the electric wire is higher than a tensile strength in a direction orthogonal to the direction along the longitudinal extension direction.

11. The wire harness according to claim 1, wherein
the functional exterior component includes a waterproof component with waterproof properties.

12. The wire harness according to claim 1, wherein
a fastener component to fasten the electric wire to a mounting object is welded to the functional exterior component.

13. The wire harness according to claim 1, wherein the shape of each of the welding horn marks is a concave-convex shape.

14. The wire harness according to claim 1, wherein in a plan view of the surface located on the opposite side of the surface on which the electric wire is disposed, each of the welding horn marks includes a curved periphery.

15. The wire harness according to claim 1, wherein in at least the part of the overlap between the insulating covering of the electric wire and the functional exterior component that is welded, a core wire of the electric wire is spaced apart from the functional exterior component by the insulating covering of the electric wire so as to not make direct contact with the functional exterior component.

16. The wire harness according to claim 1, wherein in at least the part of the overlap between the insulating covering of the electric wire and the functional exterior component that is welded, an entire periphery of a core wire of the electric wire is covered by the insulating covering of the electric wire.

17. The wire harness according to claim 1, wherein each of the welding horn marks includes the shape corresponding to the shape formed on the horn that is a horn disposed opposite from an anvil of the welding machine.

18. The wire harness according to claim 1, wherein each of the welding horn marks is disposed to overlap with the electric wire in a direction perpendicular to the longitudinal extension direction of the electric wire.

* * * * *